United States Patent
Zivkovic et al.

(10) Patent No.: US 9,909,930 B2
(45) Date of Patent: Mar. 6, 2018

(54) MULTI-SENSOR ASSEMBLY WITH TEMPATURE SENSORS HAVING DIFFERENT THERMAL PROFILES

(71) Applicant: NXP B.V., Eindhoven (NL)

(72) Inventors: Zoran Zivkovic, Hertogenbosch (NL); Kim Phan Le, Eindhoven (NL); Hilco Suy, Eindhoven (NL)

(73) Assignee: NXP B.V., Eindhoven (NL)

( * ) Notice: Subject to any disclaimer, the term of this patent is extended or adjusted under 35 U.S.C. 154(b) by 275 days.

(21) Appl. No.: 14/630,050

(22) Filed: Feb. 24, 2015

(65) Prior Publication Data
US 2016/0245706 A1  Aug. 25, 2016

(51) Int. Cl.
| | |
|---|---|
| *G01K 1/02* | (2006.01) |
| *G01K 3/08* | (2006.01) |
| *G01K 7/00* | (2006.01) |
| *H05K 1/00* | (2006.01) |
| *H05K 3/00* | (2006.01) |
| *G01K 7/16* | (2006.01) |
| *G01K 7/42* | (2006.01) |
| *H05K 1/02* | (2006.01) |

(52) U.S. Cl.
CPC .............. *G01K 7/16* (2013.01); *G01K 3/08* (2013.01); *G01K 7/427* (2013.01); *H04M 2250/12* (2013.01); *H05K 1/0201* (2013.01); *H05K 2201/10151* (2013.01)

(58) Field of Classification Search
CPC .. G01K 3/08; G01K 7/01; G01K 7/16; G01K 7/427; G01K 13/00; G01K 15/005; H05K 1/0201; H05K 2201/10151; H04M 2250/12
See application file for complete search history.

(56) References Cited

U.S. PATENT DOCUMENTS

| | | | |
|---|---|---|---|
| 4,741,476 A | 5/1988 | Russo et al. | |
| 7,364,353 B2 * | 4/2008 | Kolk | G01K 1/20 374/1 |
| 7,387,437 B2 * | 6/2008 | Brown | G01K 1/20 374/110 |
| 8,280,673 B2 * | 10/2012 | Aljabari | G01K 1/20 374/110 |
| 9,335,769 B2 * | 5/2016 | Aljabari | G05D 23/1932 |
| 9,557,228 B1 * | 1/2017 | Parvarandeh | G01D 21/00 |
| 9,709,446 B2 * | 7/2017 | Geisler | G01K 7/01 |

(Continued)

FOREIGN PATENT DOCUMENTS

| | | |
|---|---|---|
| DE | 10 2013 212 066 A1 | 1/2015 |
| EP | 2802128 A1 | 11/2014 |
| JP | 5080681 B1 * 11/2012 | ............. G01K 7/427 |

OTHER PUBLICATIONS

Extended European Search Report for Patent Appln. No. 16150932.8 (Jun. 27, 2016).

*Primary Examiner* — Randy Gibson (57) ABSTRACT

One example discloses a multi-sensor assembly, comprising: a first temperature sensor, having a first thermal profile; a second temperature sensor, having a second thermal profile different from the first thermal profile; wherein the first and second temperature sensors are mounted on a set of lead-frames; wherein the first and second temperature sensors include a first heat path input coupled to an ambient environment, and a second heat path input coupled to at least one of the lead-frames; and wherein the first and second sensors and set of lead-frames are included in a single multi-sensor assembly. Another example discloses a method of manufacture for the multi-sensor assembly.

20 Claims, 6 Drawing Sheets

(56) References Cited

U.S. PATENT DOCUMENTS

| | | |
|---|---|---|
| 2002/0080852 A1 | 6/2002 | Mirov |
| 2006/0087820 A1 | 4/2006 | Yang et al. |
| 2009/0144014 A1 | 6/2009 | Aljabari |
| 2011/0119018 A1* | 5/2011 | Skarp .............. G01K 7/42 702/130 |
| 2012/0181011 A1* | 7/2012 | Aljabari ............ G01K 1/20 165/288 |
| 2012/0185202 A1* | 7/2012 | Aljabari ............ G01K 7/42 702/130 |
| 2013/0099008 A1 | 4/2013 | Aljabari et al. |
| 2014/0328367 A1* | 11/2014 | Niederberger ........ G01K 7/42 374/1 |
| 2014/0354185 A1* | 12/2014 | Yoshida ............ G01K 7/427 315/309 |
| 2014/0376591 A1 | 12/2014 | Geisler |
| 2014/0379290 A1* | 12/2014 | Wlodarczyk ......... G01K 7/42 702/130 |
| 2015/0063402 A1* | 3/2015 | Geisler ............ G01K 13/00 374/1 |
| 2015/0253205 A1* | 9/2015 | Hauser ............. G01K 1/20 374/170 |
| 2016/0003692 A1* | 1/2016 | Ng ................. G01K 15/00 702/99 |
| 2016/0069753 A1* | 3/2016 | Phan Le ............ G01K 7/42 702/130 |
| 2016/0146678 A1* | 5/2016 | Kalyanasundaram . G01K 13/00 374/152 |
| 2016/0252268 A1* | 9/2016 | Aljabari ........... G05D 23/1932 |
| 2017/0026767 A1* | 1/2017 | Macours ........... H04R 3/007 |

* cited by examiner

MULTI-SENSOR ASSEMBLY WITH TEMPATURE SENSORS HAVING DIFFERENT THERMAL PROFILES

Various example embodiments of systems, methods, apparatuses, devices and articles of manufacture for a multi-sensor assembly are now discussed.

Temperature sensors are used within a number of devices, such as smartphones, for measuring the ambient temperature outside of the device. However, raw temperature sensor readings often do not give correct ambient temperature. Instead the temperature sensor might be placed on a printed circuit board (PCB) next to some heat sources (e.g. a processor generating heat) are present. Thus the raw temperature reading is a combination of the ambient temperature and the heat generated by a variety of heat sources.

Many dynamically changing heat sources (e.g. active components such as microprocessors) are present inside the phone, significantly elevating the temperature at the sensor compared to the true ambient temperature. In many applications it is of interest to measure the ambient temperature and remove the influence of these other heat sources.

Such sensors are based on integrated transistors/diodes embedded in a silicon die within an IC package. The IC is firmly mounted on a PCB, and together with thousands of other components, housed inside the device. Such a system can have a large thermal time constant of about half an hour or more.

Algorithms using a combination of information on the heating behaviors of the heat sources and the readings of multiple temperature sensors on various places inside the phone are used in an attempt to remove the influences of the large thermal mass of the system and heat dissipated by these heat sources and estimate the ambient temperature.

The multiple temperature sensors may be dedicated components, or may be included in another more complex component (e.g. in a processor, a battery, a display, etc.). Data from various temperature sensors are gathered to a processing point, usually the central processor, where the algorithm is deployed to estimate the ambient temperature. Such an approach depends on the accuracy and calibration of these other sensors.

However, the algorithm is more accurate if a sufficient number of temperature sensors exist within the device and sensors are well spaced and accurate. Thus the algorithm works better when the design and layout of the temperatures sensors within the device are fairly well known.

SUMMARY

According to an example embodiment, an apparatus includes a multi-sensor assembly, comprising: a first temperature sensor, having a first thermal profile; a second temperature sensor, having a second thermal profile different from the first thermal profile; wherein the first and second temperature sensors are mounted on a set of lead-frames; wherein the first and second temperature sensors include a first heat path input coupled to an ambient environment, and a second heat path input coupled to at least one of the lead-frames; and wherein the first and second sensors and set of lead-frames are included in a single multi-sensor assembly.

In another example embodiment, the first thermal profile includes a first thermal resistance; the second thermal profile includes a second thermal resistance; and the first thermal resistance is different from the second thermal resistance.

In another example embodiment, the first thermal profile includes a first heat capacity; the second thermal profile includes a second heat capacity; and the first heat capacity is different from the second heat capacity.

In another example embodiment, further comprising, an isolation layer, having a thermal resistance; wherein the second temperature sensor is coupled to the second heat path input through the isolation layer; wherein the first temperature sensor is not coupled to the second heat path input through the isolation layer; and wherein the first and second temperature sensors are not coupled to the first heat path input through the isolation layer.

In another example embodiment, a first side of the isolation layer is coupled to a top of the first temperature sensor and the second temperature sensor is coupled to a second side of the isolation layer, thereby forming a stacked first and second temperature sensor configuration.

In another example embodiment, one side of the isolation layer is coupled to a second lead-frame and the second temperature sensor is coupled to another side of the isolation layer; and one side of an adhesive layer is coupled to a first lead-frame and the first temperature sensor is coupled to another side of the adhesive layer, thereby forming a side-by-side first and second temperature sensor configuration.

In another example embodiment, a thickness of the isolation layer is greater than that of a thickness of the adhesive layer.

In another example embodiment, a thickness of the isolation layer is at least 50 μm.

In another example embodiment, a thermal resistance of the isolation layer is greater than that of a thermal resistance of the adhesive layer.

In another example embodiment, the first temperature sensor includes a band-gap temperature sensor and the second temperature sensor includes a resistive-wire temperature sensor.

In another example embodiment, the multi-sensor assembly is substantially surrounded by an encapsulant.

In another example embodiment, the encapsulant includes an opening exposing the second temperature sensor.

In another example embodiment, further comprising a processor coupled to the first and second temperature sensors and configured to filter the second heat path input from the first heat path input.

In another example embodiment, further comprising a second isolation layer and a third temperature sensor; and wherein a first side of the second isolation layer is coupled to a top of the second temperature sensor and the third temperature sensor is coupled to a second side of the second isolation layer, thereby forming a triple-stacked first, second and third temperature sensor configuration.

In another example embodiment, a method of manufacture for a multi-sensor assembly, comprises fabricating a first temperature sensor, having a first thermal profile; fabricating a second temperature sensor, having a second thermal profile different from the first thermal profile; forming a first heat path between an ambient environment and the first and second temperature sensors; forming a second heat path between a set of lead-frames and the first and second temperature sensors; and including the first and second sensors and set of lead-frames in a single multi-sensor assembly.

In another example method embodiment, further comprising: adding an isolation layer in the second heat path between at least one of the lead-frames and the second temperature sensor.

In another example method embodiment, further comprising: coupling a first side of the isolation layer to a top of the first temperature sensor; and coupling the second temperature sensor to a second side of the isolation layer, thereby forming a stacked first and second temperature sensor configuration.

In another example method embodiment, further comprising: coupling one side of the isolation layer to a second lead-frame; coupling the second temperature sensor to another side of the isolation layer; coupling one side of an adhesive layer to a first lead-frame; and coupling the first temperature sensor to another side of the adhesive layer, thereby forming a side-by-side first and second temperature sensor configuration.

The above discussion is not intended to represent every example embodiment or every implementation within the scope of the current or future claim sets. The figures and Detailed Description that follow also exemplify various example embodiments.

Various example embodiments may be more completely understood in consideration of the following Detailed Description in connection with the accompanying Drawings, in which:

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Design principles are described herein where a set of temperature sensors are placed within a single multi-sensor assembly and their readings are combined and used to remove the influence of a set of heat sources. The sensors are isolated and can have different thermal/heat capacities to react differently to temperature and heat sources.

In one example embodiment, the sensors are placed along at least one thermal path from a set of heat sources to an ambient environment. Thermal isolation placed between the temperature sensors and differences in the temperature sensor's heat capacity enable ambient temperature to be measured in response to both static and dynamically changing heat source driven temperature variations.

In another example embodiment, the temperature sensors are placed in separate chips put into a so called "multi-chip assembly". The chips can be placed for example on top of each other and isolated by an isolating layer in-between. The chip sizes might be significantly different to increase the difference in heat capacity.

The set of temperature sensors can also use different temperature sensing principles. For example the band-gap sensors can be placed deep inside the silicon and close to heat paths and internal and external heat sources. Resistive wire based sensors can be designed on top of the chip in close contact with the air. The wire sensor can be thermally isolated from the rest of the silicon using isolating layer or making the wire free hanging.

The multiple sensors will react differently to heat sources and ambient temperature and their changes due to thermal resistance and heat capacity differences. From the differences in the measurements the ambient temperature can be extracted and influence of other sources removed. The accuracy of the solution will mainly depend on the relative accuracy of the differences between the sensors.

An algorithm for extracting the ambient temperature can be implemented in the same chip as dedicated processing or on microcontroller.

The multi-sensor assembly described herein is independent of other sensors external to the single assembly. Accuracy, calibration and an algorithm can be provided within the single multi-sensor assembly and thereby provide repeatable temperature output values regardless of the application. Ambient temperature estimates can be improved since additional thermal gradient information is obtained locally within the single assembly. Power consumption can be reduced by adding local processing to extract the ambient information only when needed since the information is available locally. The multi-sensor assembly makes its placement easier and the overall system simpler, since the information to estimate the temperature is contained in the single device.

Figure 1:
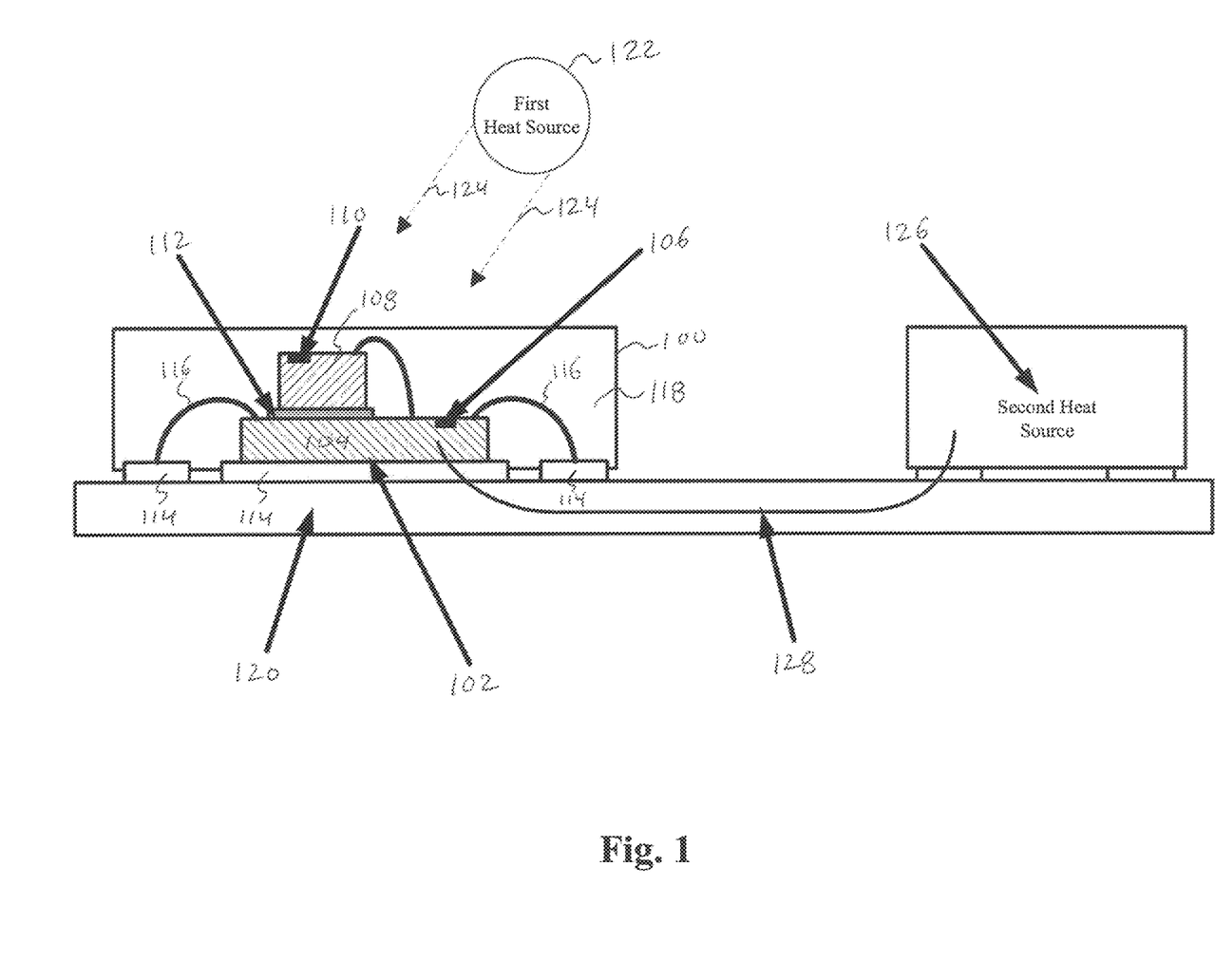
FIG. 1 is a first example multi-sensor assembly.

FIG. 1 is a first example multi-sensor assembly 100. The multi-sensor assembly 100 includes a first temperature sensor 106, having a first thermal profile, mounted in a first circuit 104 (e.g. a silicon die, semiconductor chip, etc.). An adhesive layer 102 bonds the first circuit 104 to an optional substrate (e.g. a heat-sink) which is then bonded to a lead-frame 114.

A second temperature sensor 110, having a second thermal profile, different from the first thermal profile, and mounted in a second circuit 108 (e.g. a silicon die, semiconductor chip, etc.). An isolation layer 112 (e.g. adhesive glue) bonds the second circuit 108 to the first circuit 104. In one example the first and second temperature sensors 106, 110 are mounted on a lead-frame 114.

Bond-wires 116 electrically connect the first and second circuits 104, 108 to the lead-frame 114, all of which is then surrounded by an encapsulant 118 (e.g. molding compound). The multi-sensor assembly 100 can then be mounted to a circuit board 120 (e.g. PCB).

In one example embodiment, the temperature sensors 106, 100 can be stacked on top of each other as shown in FIG. 1, however, in an alternate embodiment the temperature sensors 106, 100 are placed side-by-side, as is presented in other figures.

The first and second temperature sensors 106, 110 include a first heat source 122 heat path 124 input coupled to an ambient environment (i.e. the first heat source 122), and a second heat source 126 heat path 128 input coupled to the second heat source 126 through the lead-frame. The second heat path 128, in one example, transmits thermal energy from the second heat source 126 through the circuit board 120 and electrical connection traces on the circuit board 120 to the assembly 100. For the purposes of this discussion, the first heat source 122 can be either at a higher or lower temperature than the second heat source 126.

A sensor's, device's or material's thermal profile is herein defined to include the sensor's, device's or material's ability to absorb, release and conduct heat. The first and second temperature sensor's 106, 110 thermal profiles are designed such that temperature differences between the two heat sources 122, 126 results in a measurable temperature difference between the two sensors 106, 110.

For example, if each temperature sensor 106, 110 has a 0.2K (Kelvin) temperature measurement resolution (which is common detection accuracy for modern CMOS sensors), then the individual thermal profiles of the sensors 106, 110 must result in a temperature difference between the sensors 106, 110 of something greater than 0.2K. Such sensors 106, 110 may, for example, be with the help of algorithms able to translate such a greater than 0.2K temperature difference to a 10K difference between the heat sources 122, 126.

The greater a difference between the first and second temperature sensor's 106, 110 thermal profile, then the greater the accuracy of the ambient temperature calculation, even if the sensor's 106, 110 resolution stays the same. For example, in one example the thermal profile of the first temperature sensor 106 differs from the thermal profile of the second temperature sensor 110 by at least 2-to-1 (i.e. 2:1 ratio). Many other thermal profile difference ratios are also possible.

The first and second temperature sensor's 106, 110 thermal profiles can be differentiated in a variety of ways, such as by differentiating their: thermal resistances, heat capacity, thermal time constants, thermal characteristics, temperature differences over time, or temperature differences across the circuits 104, 108 or the assembly 100.

Differences in thermal resistance between the first and second temperature sensors 106, 110, such as toward the ambient and the local/PCB heat sources, can be achieved in a variety of ways, which are now discussed.

One way adds an isolation layer 112, having a thermal profile, between the second temperature sensor 110 and the second heat source 126 but not between the second temperature sensor 110 and the first heat source 122. In this example, the first temperature sensor 106 is not so isolated. In an additional example, the thermal profiles of the temperature sensors with respect to a heat source or to common ambient are kept as different as possible, such as adding isolation between 110 and 126, but not between 106 and 126.

The isolation layer 112 also acts as a glue layer between the first and second circuits 104, 108 holding the first and second temperature sensors 106, 110. A thickness of the isolation layer 112 should be sufficiently large to have a thermal resistance between the sensors 106, 110 which is substantially greater than a thickness of an adhesive layer 102 between the first temperature sensor 106 and the leadframe 114. In an alternate example, the isolation layer 112 can be made of a different material which increases thermal resistance so that the isolation layer's 112 thickness does not need to be increased.

For example, a non-conducting glue, such as used in IC packaging technology, having a thickness over 35 μm for the isolation layer 112 could work if the adhesive layer 102 has a thickness in the range of 10 to 30 μm. An isolation layer 112 at least double that of the adhesive layer 102 would work as well.

Another way to increase thermal resistance differentiation between the temperature sensors 106, 110 is by stacking the first and second circuits 104, 108. A first side of the isolation layer is coupled to a top of the first temperature sensor and the second temperature sensor is coupled to a second side of the isolation layer, thereby forming a stacked first and second temperature sensor configuration.

Heat capacity differentiation between the temperature sensors 106, 110 can be achieved by designing the first and second circuits 104, 108 (in which the temperature sensors 106, 110 are held) to have substantially different sizes/masses. For circuits 104, 108 which are silicon wafers, a first silicon die having either an area or thickness at least two times greater than a second silicon die would work.

Logical circuits and/or a computer processor (not shown) could be included either within the multi-sensor assembly 100 or electrically interface with the multi-sensor assembly 100. The logical circuits and/or a computer processor would receive output signals from the temperature sensors 106, 110 and algorithmically estimate the ambient temperature (i.e. the temperature of the first heat source 122) by filtering the second heat source 126 heat path 128 input from the first heat source 122 heat path 124 input. This is discussed in more detail below.

The multi-sensor assembly 100 in another embodiment further includes a second isolation layer (not shown) and a third temperature sensor (not shown) having a third thermal profile. A first side of the second isolation layer would be coupled to a top of the second temperature sensor 110 and the third temperature sensor would be coupled to a second side of the second isolation layer, thereby forming a triple-stacked first, second and third temperature sensor configuration. Such additional thermally differentiated temperature sensors would further increase an accuracy of an ambient temperature measurement.

Figure 2:
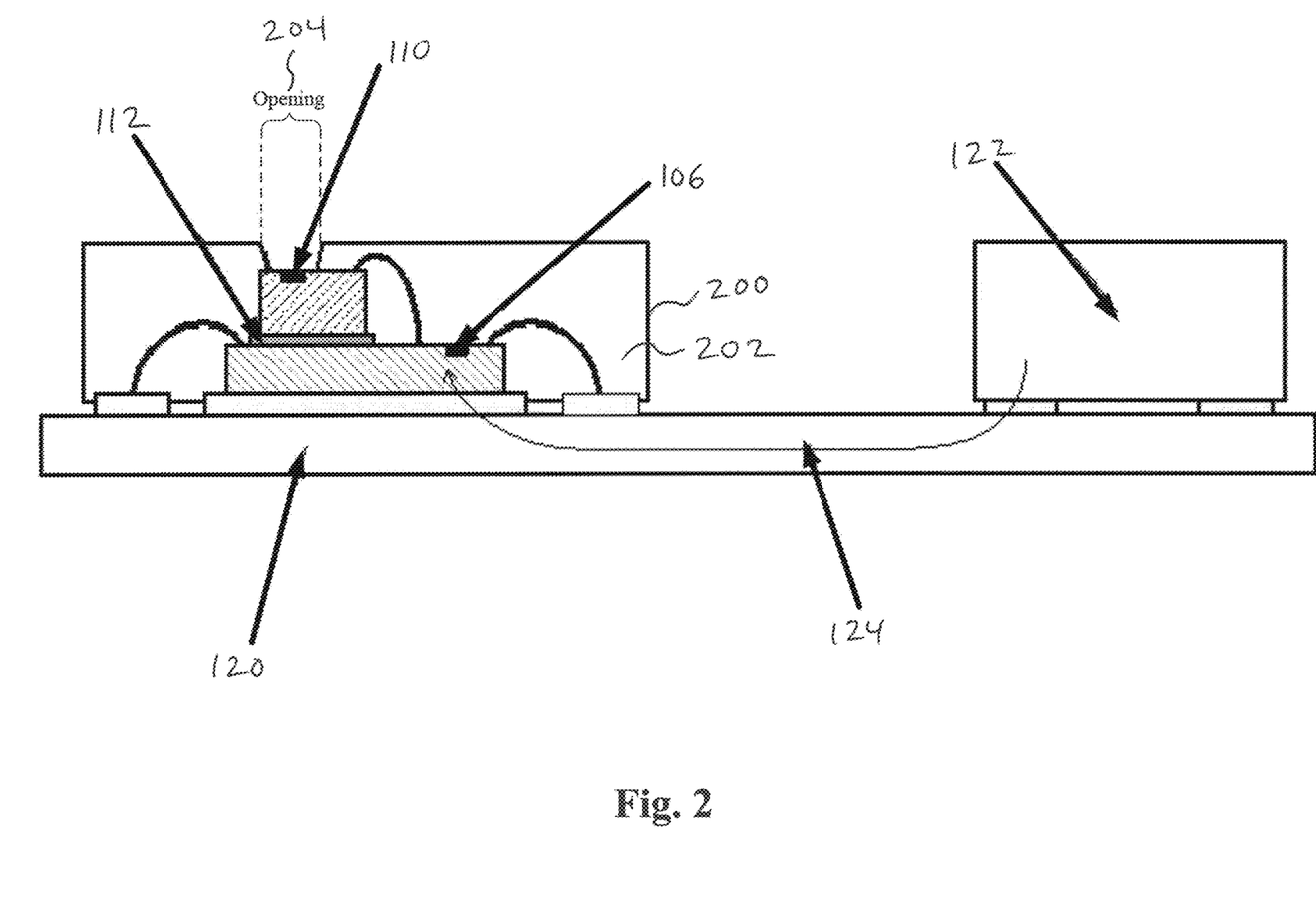
FIG. 2 is a second example multi-sensor assembly.

FIG. 2 is a second example multi-sensor assembly 200. In addition to most of the elements introduced in FIG. 1, the second multi-sensor assembly 200 includes an encapsulant 202 having an opening 204 exposing the second temperature sensor 110 to the first heat source 122 (e.g. an ambient environment).

The opening 204 permits the second temperature sensor 110 to be in direct contact with the first heat source 122 (e.g. an ambient environment, such as the air). Thus the opening 204 in the assembly 200 encapsulant 202 increases a thermal contact between the second temperature sensor 110 and the first heat path 124 from the first heat source 122 (e.g. the ambient environment). Such direct contact improve an accuracy of the estimated ambient temperature measurement by increasing thermal profile differentiation between the first temperature sensor 106 and the second temperature sensor 110.

Figure 3:
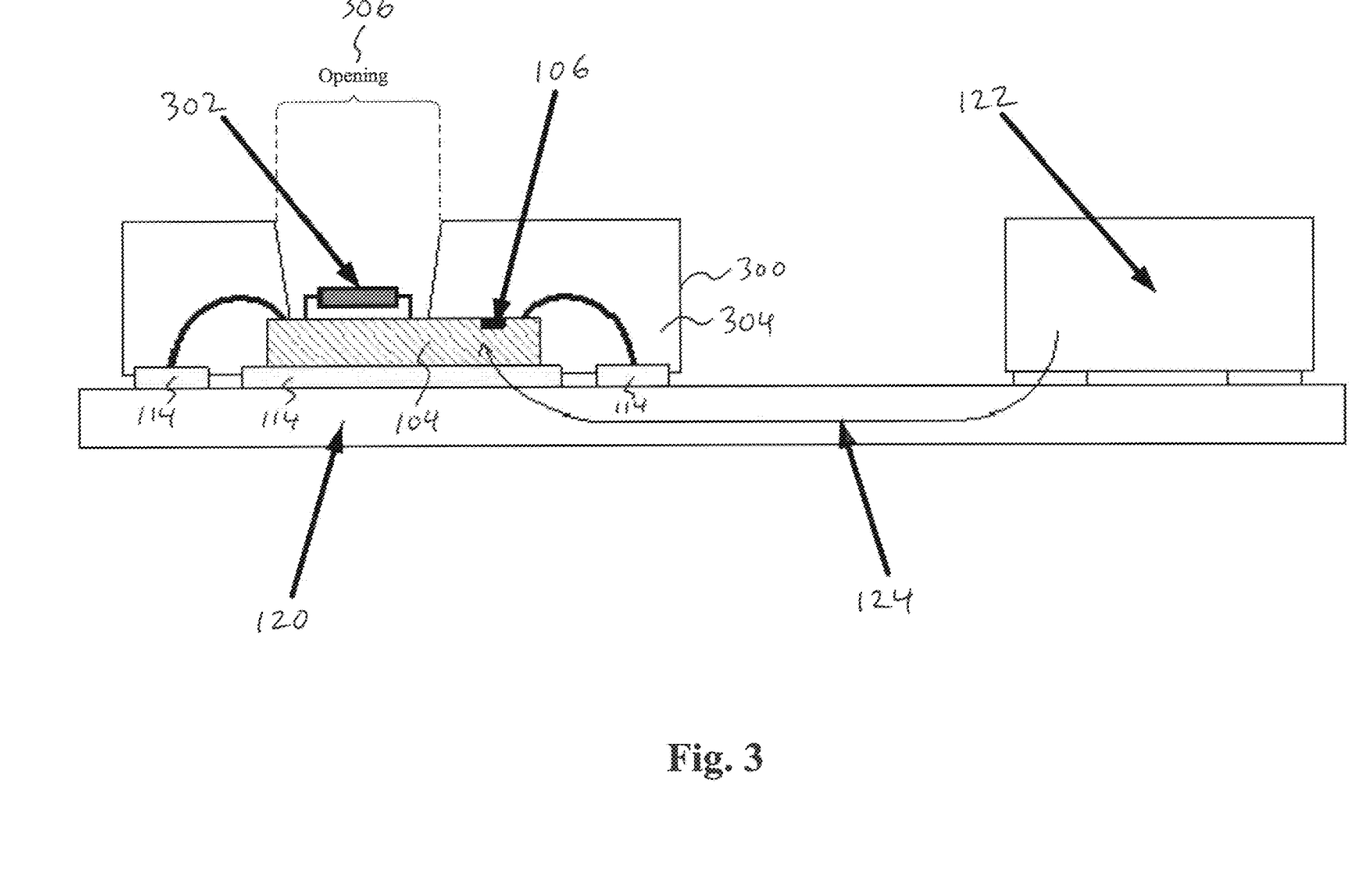
FIG. 3 is a third example multi-sensor assembly.

FIG. 3 is a third example multi-sensor assembly 300. In addition to some of the elements introduced in FIG. 1, the third multi-sensor assembly 300 further includes a second temperature sensor which is a resistive wire sensor 302 and an encapsulant 304 with an opening 306. The third example assembly 300 presents an embodiment wherein the first and second temperature sensors (e.g. prior 106, 110) use different sensing principles.

In this third example assembly 300, the first temperature sensor 106 includes a band-gap temperature sensor and the second temperature sensor includes a resistive-wire temperature sensor 302. The first temperature sensor 106 can be a standard band-gap temperature sensor inside the first circuit 104 (e.g. a silicon die). This sensor 106 will be more influenced by the second heat source 126 on the PCB 120.

The second temperature sensor (i.e. the resistive wire sensor 302) can be fabricated on top of the first circuit 104. This sensor 302 in one example is isolated from the die using a thermally isolating layer (not shown) in between the sensor 302 and the die. However FIG. 3 shows an example where the sensor 302 is fabricated to be free hanging and isolated by a small amount of gas (e.g. air) or vacuum in between the sensor 302 and the first circuit 104. The resistive wire sensor 302 can be exposed to an ambient environment through the opening 306 in the assembly's 300 encapsulant/molding compound 304. The resistive wire sensor 302 will be less influenced by the other heat sources (e.g. such as the second heat source 126) on the PCB 120 and more by the ambient environment (i.e. the first heat source 122). In this way, the first and second sensors (e.g. prior 106, 110) can be further differentiated, thereby improving an accuracy of the estimated ambient temperature measurement.

Figure 4:
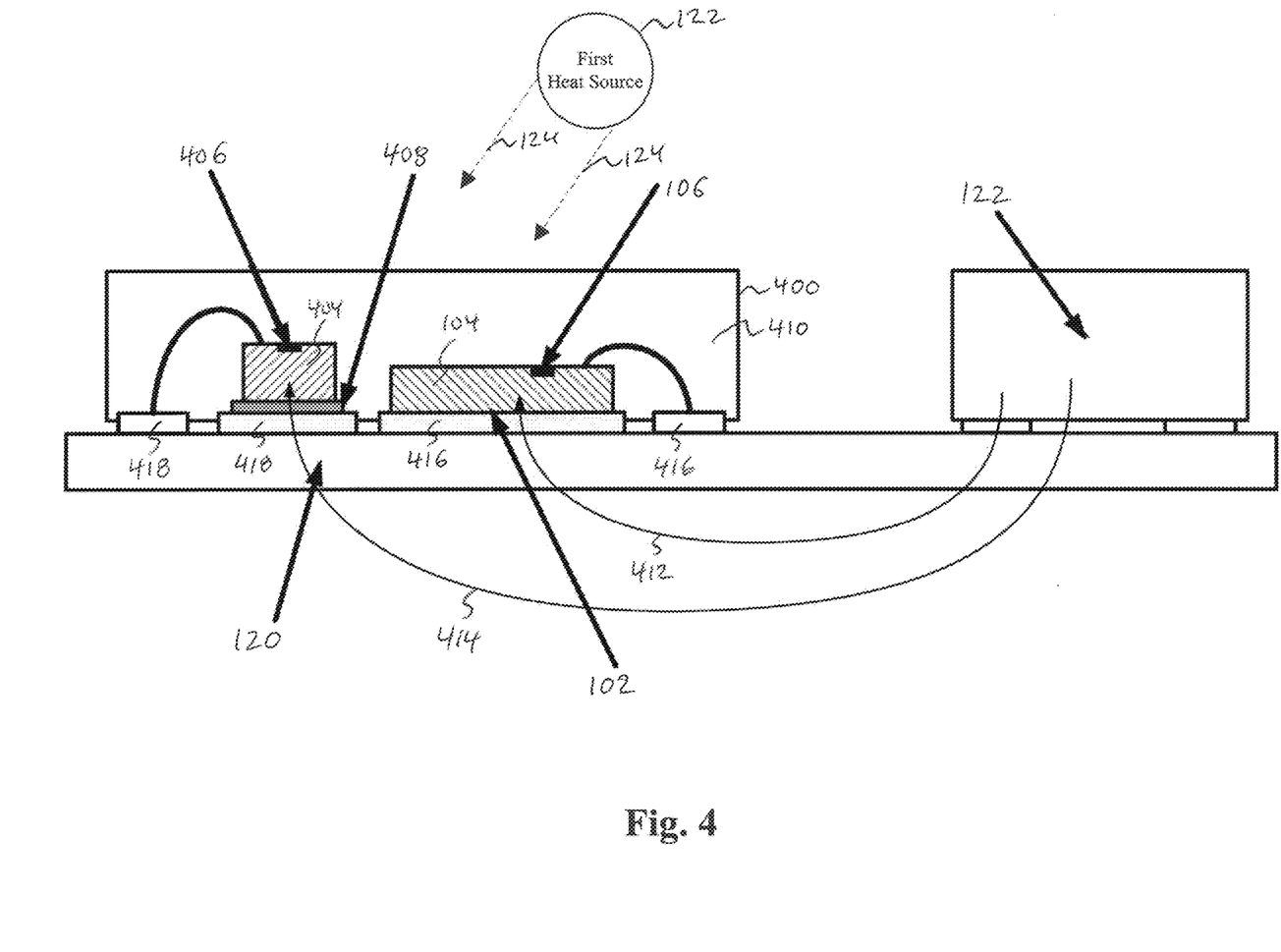
FIG. 4 is a fourth example multi-sensor assembly.

FIG. 4 is a fourth example multi-sensor assembly 400. In addition to some of the elements introduced in FIG. 1, the fourth assembly 400 further includes a second circuit 404, second temperature sensor 406, an isolation layer 408, an encapsulant 410, a first heat path 412, a second heat path 414, a first lead-frame 416 and a second lead-frame 418. The fourth example assembly 400 presents a side-by-side temperature sensor configuration on two separated lead-frames 416, 418 but within a single multi-chip assembly 400.

In this example, one side of the isolation layer 408 is coupled to the second lead-frame 418, while the second temperature sensor 406 in the second circuit 404 is coupled to the other side of the isolation layer 408. One side of an adhesive layer 102 is coupled to the first lead-frame 416, and the first temperature sensor 106 in the first circuit 104 is coupled to the other side of the adhesive layer 102, thereby forming a side-by-side first and second temperature sensor 106, 406 configuration. In one example, a thickness of the isolation layer 408 is at least twice that of a thickness of the adhesive layer 102. While the first and second lead-frames 416, 418 could be combined into a single lead-frame 114, this would lessen the differentiation between the sensors 106, 406.

The greater differentiation in the sensors' 106, 406 thermal profile, then the more accurate the estimated ambient (i.e. first heat source 122) temperature. Following are some example embodiments for accomplishing this. In one example, thermal differentiation between the temperature sensors 106. 406 can be further increased of the first and second circuits 104, 404 have significantly different heat capacities (e.g. different sizes/areas and/or thicknesses), which influences their thermal mass and dynamic temperature response.

In another example, the thermal differentiation between the sensors 106, 406 can be further increased by orienting the assembly 400 within the PCB 120 such that the first temperature sensor 106, having a least thermal isolation, is closest to the second heat source 126. Also, if the encapsulant 410 is modified to create an opening (not shown) above the second temperature sensor 406, then the sensor 406 can be exposed directly to the first heat source 122 (e.g. ambient air). This would further increase the thermal contact of the second temperature sensor 406 with the first heat source 122 and thereby further differentiate the thermal behavior between the sensors 106, 406.

Figure 5:
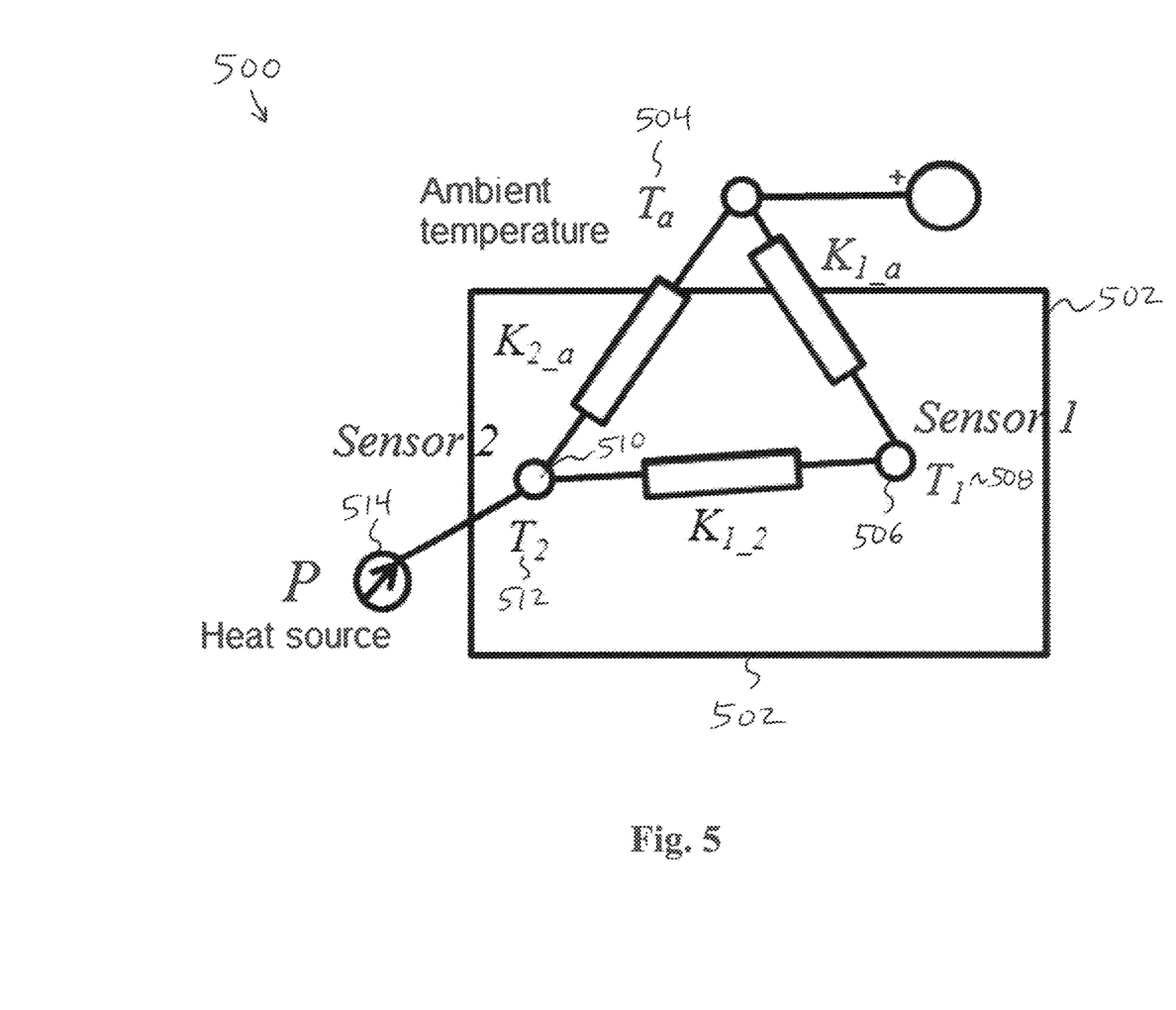
FIG. 5 is an example thermal model of an example multi-sensor assembly.

FIG. 5 is an example thermal model 500 of an example multi-sensor assembly 502. Equations for extracting an ambient temperature (Ta) 504 from a first temperature sensor 506, generating a first temperature output value (T1) 508, and a second temperature sensor 510, generating a second temperature output value (T2) 512, are now discussed.

The readings of the two sensors 506, 510 can be combined to remove the influence of an additional heat source 514 and estimate the ambient temperature 504. Principles for such extraction and base algorithm are described next.

When the multi-sensor assembly 502 is in equilibrium the thermal model 500 can be approximated by the following equations:

$$0 = (T_2 - T_1)K_{1\_2} + (T_a - T_1)K_{1\_a}$$

$$0 = (T_1 - T_2)K_{1\_2} + (T_a - T_2)K_{2\_a} + P$$

Where $K_{1\_2}$, $K_{2\_a}$ $K_{1\_a}$ are lumped thermal conductance values of the system and P is the thermal power of the heat source 514. The temperature readings 508, 512 of the temperature sensors 506, 510 are: $T_1$ and $T_2$. The unknown ambient temperature 504 to be estimated is denoted by $T_a$.

One possible solution to estimate the ambient temperature 504 is:

$$T_a = T_1 - \frac{(T_2 - T_1)K_{1\_2}}{K_{1\_a}}$$

As can be seen from the above equation, measured small local difference in temperature $(T_2 - T_1)$ can be used to remove large influence of other heat sources. Total error of the corrected ambient measurement is a combination of two errors: the absolute error of the first temperature sensor 506 and the relative error between the first and second temperature sensors 506, 510 which is multiplied by the factor that depends on the thermal conductivities. Accurate factory calibration of a difference between the first and second temperature sensors 506, 510 reduces the error of the ambient temperature 504 estimation.

In case of dynamic temperature changes the temperature gradients and thermal capacities of the components are taken into account and similar solutions can be derived.

Figure 6:
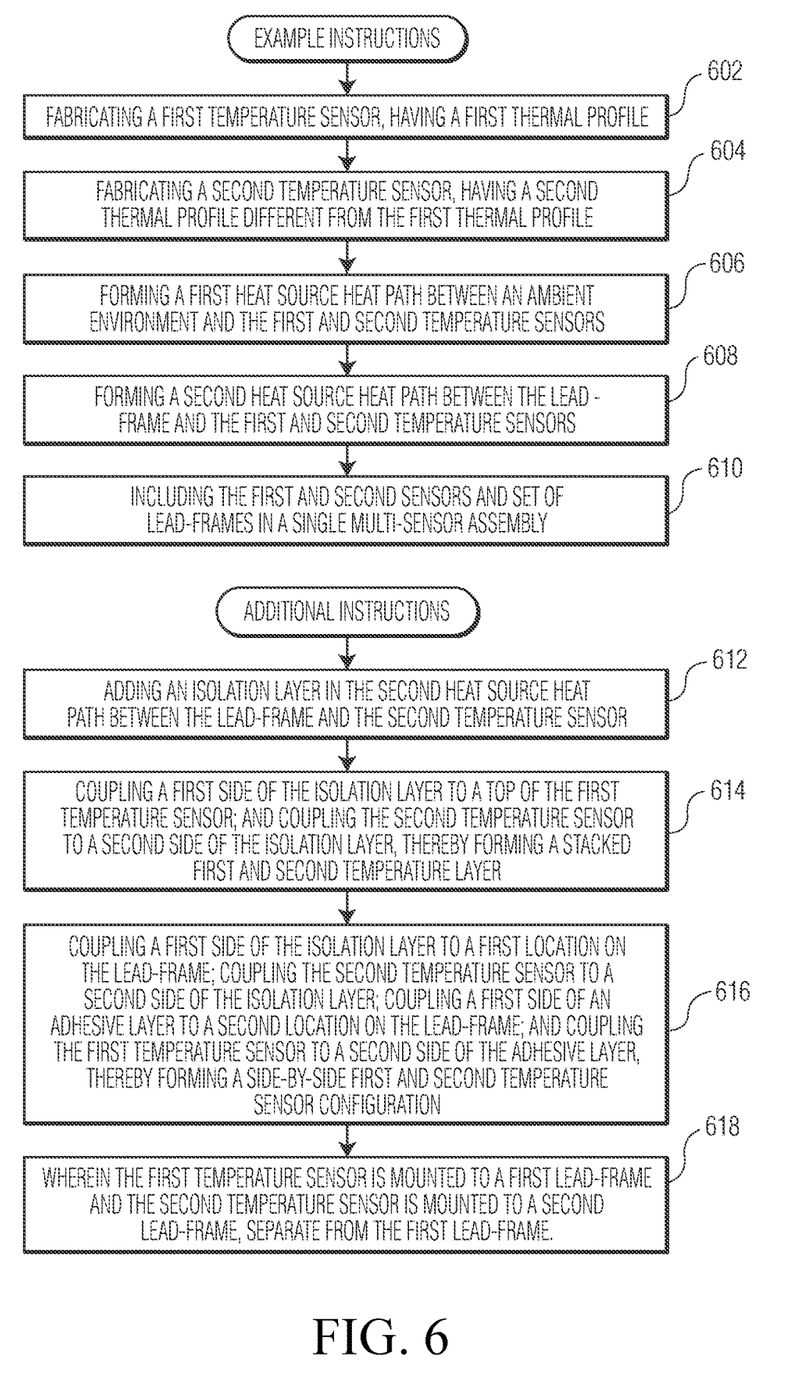
FIG. 6 is an example method of manufacturing an example multi-sensor assembly.

FIG. 6 is an example method 600 of manufacturing an example multi-sensor assembly. The order in which the method is discussed does not limit the order in which other example embodiments implement the method. Additionally, in some embodiments the instructions are implemented concurrently.

A first example method begins in 602, by fabricating a first temperature sensor, having a first thermal profile. Next, in 604, fabricating a second temperature sensor, having a second thermal profile different from the first thermal profile. Then in 606, forming a first heat source 122 heat path 124 between an ambient environment and the first and second temperature sensors. In 608, forming a second heat source 126 heat path 128 between the lead-frame 114 and the first and second temperature sensors. Then in 610, including the first and second sensors and set of lead-frames in a single multi-sensor assembly.

The elements in method just discussed can be augmented or replaced with one or more of the following additional method elements, presented in no particular order.

In 612, adding an isolation layer in the second heat source 126 heat path 128 between the lead-frame 114 and the second temperature sensor. In 614, coupling a first side of the isolation layer to a top of the first temperature sensor; and coupling the second temperature sensor to a second side of the isolation layer, thereby forming a stacked first and second temperature sensor configuration. In 616, coupling a first side of the isolation layer to a first location on the lead-frame 114; coupling the second temperature sensor to a second side of the isolation layer; coupling a first side of an adhesive layer to a second location on the lead-frame 114; and coupling the first temperature sensor to a second side of the adhesive layer, thereby forming a side-by-side first and second temperature sensor configuration. Then in 618, wherein the first temperature sensor is mounted to a first lead-frame and the second temperature sensor is mounted to a second lead-frame, separate from the first lead-frame.

The method steps in the above figure can be executed in any order, unless a specific order is explicitly stated. Also, those skilled in the art will recognize that while one example method has been discussed, the material in this specification can be combined in a variety of ways to yield other examples as well, and are to be understood within a context provided by this detailed description.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A multi-sensor assembly, comprising:
   a first temperature sensor, having a first thermal profile;
   a second temperature sensor, having a second thermal profile different from the first thermal profile;
   wherein the first and second temperature sensors are mounted on a set of lead-frames;
   wherein the first and second temperature sensors include a first heat path input coupled to an ambient environment, and a second heat path input coupled to at least one of the lead-frames; and
   wherein the first and second sensors and set of lead-frames are included in a single multi-sensor assembly;
   wherein the first thermal profile is defined by the ability of the first temperature sensor to absorb, release and conduct heat; and
   wherein the second thermal profile is defined by the ability of the second temperature sensor to absorb, release and conduct heat.

2. The assembly of claim 1:
   wherein the first thermal profile includes a first thermal resistance;
   wherein the second thermal profile includes a second thermal resistance; and
   wherein the first thermal resistance is different from the second thermal resistance.

3. The assembly of claim 1:
   wherein the first thermal profile includes a first heat capacity;
   wherein the second thermal profile includes a second heat capacity; and
   wherein the first heat capacity is different from the second heat capacity.

4. The assembly of claim 1:
   further comprising, an isolation layer, having a thermal resistance;
   wherein the second temperature sensor is coupled to the second heat path input through the isolation layer;
   wherein the first temperature sensor is not coupled to the second heat path input through the isolation layer; and
   wherein the first and second temperature sensors are not coupled to the first heat path input through the isolation layer.

5. The assembly of claim 4:
   wherein a first side of the isolation layer is coupled to a top of the first temperature sensor and the second temperature sensor is coupled to a second side of the isolation layer, thereby forming a stacked first and second temperature sensor configuration.

6. The assembly of claim 4:
   wherein one side of the isolation layer is coupled to a second lead-frame and the second temperature sensor is coupled to another side of the isolation layer; and
   wherein one side of an adhesive layer is coupled to a first lead-frame and the first temperature sensor is coupled to another side of the adhesive layer, thereby forming a side-by-side first and second temperature sensor configuration.

7. The assembly of claim 6:
   wherein a thickness of the isolation layer is greater than that of a thickness of the adhesive layer.

8. The assembly of claim 1:
   wherein a thickness of the isolation layer is at least 50 μm.

9. The assembly of claim 6:
   wherein a thermal resistance of the isolation layer is greater than that of a thermal resistance of the adhesive layer.

10. The assembly of claim 1:
    wherein the first temperature sensor includes a band-gap temperature sensor and the second temperature sensor includes a resistive-wire temperature sensor.

11. The assembly of claim 1:
    wherein the multi-sensor assembly is substantially surrounded by an encapsulant.

12. The assembly of claim 11:
    wherein the encapsulant includes an opening exposing the second temperature sensor.

13. The assembly of claim 1:
    further comprising a processor coupled to the first and second temperature sensors and
    configured to filter the second heat path input from the first heat path input.

14. The assembly of claim 1:
    further comprising a second isolation layer and a third temperature sensor; and
    wherein a first side of the second isolation layer is coupled to a top of the second temperature sensor and the third temperature sensor is coupled to a second side of the second isolation layer, thereby forming a triple-stacked first, second and third temperature sensor configuration.

15. A method of manufacture, for a multi-sensor assembly, comprising:
    fabricating a first temperature sensor, having a first thermal profile, wherein the first thermal profile is defined by the ability of the first temperature sensor to absorb, release and conduct heat;
    fabricating a second temperature sensor, having a second thermal profile, wherein the second thermal profile is defined by the ability of the second temperature sensor to absorb, release and conduct heat, wherein the second thermal profile is different from the first thermal profile;
    forming a first heat path between an ambient environment and the first and second temperature sensors;
    forming a second heat path between a set of lead-frames and the first and second temperature sensors; and
    including the first and second sensors and set of lead-frames in a single multi-sensor assembly.

16. The method of claim 15, further comprising:
    adding an isolation layer in the second heat path between at least one of the lead-frames and the second temperature sensor.

17. The method of claim 16, further comprising:
    coupling a first side of the isolation layer to a top of the first temperature sensor; and
    coupling the second temperature sensor to a second side of the isolation layer, thereby forming a stacked first and second temperature sensor configuration.

18. The method of claim 16, further comprising:
coupling one side of the isolation layer to a second lead-frame;
coupling the second temperature sensor to another side of the isolation layer;
coupling one side of an adhesive layer to a first lead-frame; and
coupling the first temperature sensor to another side of the adhesive layer, thereby forming a side-by-side first and second temperature sensor configuration.

19. The assembly of claim 1:
wherein the first temperature sensor is mounted in a first silicon die and the second temperature sensor is mounted in a second silicon die; and
wherein the first silicon die has an area or thickness at least two times greater than an area or thickness of the second silicon die.

20. The assembly of claim 1:
wherein the first temperature sensor is mounted in a first silicon die and includes a band-gap temperature sensor and the second temperature sensor includes a resistive-wire temperature sensor;
wherein the multi-sensor assembly is substantially surrounded by an encapsulant, wherein the encapsulant includes an opening exposing the second temperature sensor to an ambient environment; and
wherein the resistive-wire temperature sensor is free hanging and separated by a gas in between the first silicon die and the resistive-wire temperature sensor.

* * * * *